United States Patent
Lee et al.

(10) Patent No.: US 6,764,944 B2
(45) Date of Patent: Jul. 20, 2004

(54) METHOD FOR FORMING METAL WIRE INTERCONNECTION IN SEMICONDUCTOR DEVICES USING DUAL DAMASCENE PROCESS

(75) Inventors: Young-Mo Lee, Kyoungki-do (KR); Jeong-Kweon Park, Kyoungki-do (KR)

(73) Assignee: Hyundai Electronics Industries Co., Ltd., Kyoungki-Do (KR)

( * ) Notice: Subject to any disclaimer, the term of this patent is extended or adjusted under 35 U.S.C. 154(b) by 22 days.

(21) Appl. No.: 09/934,499

(22) Filed: Aug. 22, 2001

(65) Prior Publication Data

US 2002/0058370 A1 May 16, 2002

(30) Foreign Application Priority Data

Aug. 31, 2000 (KR) .......................................... 2000-51330

(51) Int. Cl.[7] .............................................. H01L 21/44
(52) U.S. Cl. ...................................... 438/636; 438/637
(58) Field of Search .......................... 438/618, 622–4, 438/636–8, 723–5, 736–8, 740

(56) References Cited

U.S. PATENT DOCUMENTS 6,323,121 B1 * 11/2001 Liu et al. .................... 438/633

FOREIGN PATENT DOCUMENTS

JP  2000208620 A  * 7/2000  ......... H01L/21/768

* cited by examiner

*Primary Examiner*—Wael Fahmy
*Assistant Examiner*—Ginette Peralta
(74) *Attorney, Agent, or Firm*—Marshall, Gerstein & Borun LLP

(57) ABSTRACT

A method for preventing a diffused reflection from being generated in patterning a via hole for the metal interconnection is disclosed. The disclosed method includes: forming an insulation layer on a semiconductor substrate, wherein elements for operating a semiconductor device are formed on the semiconductor substrate; forming first photoresist patterns on the insulation layer; etching the insulation layer in order to form a first via hole using the first photoresist patterns and then forming a resulting structure; coating a first anti-reflecting coating layer on the resulting structure with a low viscosity; coating a second anti-reflecting coating layer on the resulting structure with a low viscosity; forming second photoresist patterns on the second anti-reflecting coating layer; and forming a second via hole using the second photoresist patterns.

16 Claims, 5 Drawing Sheets

METHOD FOR FORMING METAL WIRE INTERCONNECTION IN SEMICONDUCTOR DEVICES USING DUAL DAMASCENE PROCESS

TECHNICAL FIELD

A method for forming a metal wire interconnection in a semiconductor device is disclosed, and more particularly, a method for preventing a diffused reflection from being generated in patterning a via hole for the metal interconnection is disclosed.

DESCRIPTION OF THE RELATED ART

Generally, the "Damascene" process is to form a semiconductor wire by using the etch-back process or the chemical mechanical polishing (CMP) process in a semiconductor fabricating method. In the Damascene process, an insulation layer is etched in the form of a wire by the photolithography process and then a recess is formed with a predetermined depth. The recess is filled with a conducting layer, such as a tungsten layer, and the undesired conducting layer is etched back by using the etch-back process or the chemical mechanical polishing (CMP) process.

This technique has been used for forming bit lines and word lines in a DRAM devices. In the case where the Damascene process is used for the bit lines in DRAM devices, the recesses are formed in an insulation layer along the metal wires of the bit lines and contact holes for connecting the metal wires to a semiconductor substrate are also formed by the photolithography process. Subsequently, the recesses and the contact holes are filled with metal materials and the undesired metal materials on the insulation layer are removed.

In the case where the bit lines are formed by the Damascene process, the interconnection between the bit line and an active region of the semiconductor substrate is simultaneously formed with the metal wire and then topology caused by other adjacent layers may be improved with facility of the following processing steps.

On the other hand, in the semiconductor fabricating method, the metal layers are formed in a dual structure or in a multi-structure and typically, the metal layers are made of aluminum. Accordingly, the aluminum layer has a high reflexibility which causes the reflected light for patterning the aluminum layer to make the notching or thinning thereof. With the increase of the integration in semiconductor devices, this problem more appears because of the narrow width of the metal layer.

FIGS. 1A to 1D are cross-sectional views illustrating a method for forming a via first which is widely used in a conventional Damascene process. Referring to FIG. 1A, a first SiN layer 12, as an etching stopper, is formed on a semiconductor substrate 11 on which predetermined processes have been carried out. A first $SiO_2$ layer 13 is formed on the first SiN layer 12, a second SiN layer 14, as an etching stop layer, is formed on the $SiO_2$ layer 13 in a contact level of the topology, and then a second $SiO_2$ layer 15 is formed on the second SiN layer 14. Photoresist patterns 16 are formed on the second $SiO_2$ layer 15 using a photoresist layer.

Referring to FIG. 1B, the second $SiO_2$ layer 15, the second SiN layer 14 and the first $SiO_2$ layer 13 are selectively etched using the photoresist patterns 16 as an etching mask layer, thereby forming a via hole 17.

Referring to FIG. 1C, an organic anti-reflecting coating layer (ARC) 18 is formed on the resulting structure in order to prevent the pattern profile from being deteriorate by a diffused reflection in the via hole 17. The ARC layer 18 is also deposited on the bottom of the via hole 17 and has a viscosity such that a layer of approximately 900 Å will be deposited at a spin rate of 3000 rpm with a resulting thickness of approximately 1000 Å to 1400 Å. In the case where the size of the via hole 17 is not sufficient for a deposition process, the via hole 17 is not completely filled with the ARC layer 18. Typically, the ARC layer 18 is deposited in a track, which is one of steppers, using a spinner. Subsequently, a photoresist layer is formed on the ARC layer 18 and patterned so as to form photoresist patterns 19 exposing a portion of the ARC layer 18 around the via hole 17.

Referring to FIG. 1D, the exposed ARC layer 18 and the second $SiO_2$ layer 15 are etched using the photoresist patterns 19 as an etching mask, thereby forming a final step-type via hole 20. In the etching process, the ARC layer 18 may prevent the loss of the via hole 17 as well as the diffused reflection. A conducting layer (not shown) is deposited on the resulting structure including the via hole 20 and patterned by the etch-back process or the chemical mechanical polishing process so that the conducting layer, such as a metal wire, a word line or a bit line, remains only within the via hole 20.

As stated above, the Damascene process forms the conducting layer after forming the via hole in the insulation layer. Therefore, the metal interconnection and the via hole for electrically connecting one metal layer to the other metal layer are simultaneously formed. However, in the case where the high-viscosity ARC layer is used in a small-sized vial hole based on the development of the exposure techniques and in a miniaturized chip, it is impossible to obtain a sufficient step-coverage of the ARC layer for preventing the diffused reflection within the via hole.

SUMMARY OF THE DISCLOSURE

A method for forming metal wires of semiconductor devices using a dual Damascene process to obtain a sufficient filling of an organic anti-reflecting coating layer (ARC) is disclosed.

A method for forming highly integrated circuits by preventing a diffused reflection generated over an under layer of a photoresist layer is also disclosed.

A method for forming a metal wire using a Damascene process is disclosed which comprises forming an insulation layer on a semiconductor substrate, wherein elements for operating a semiconductor device are formed on the semiconductor substrate; forming first photoresist patterns on the insulation layer; etching the insulation layer in order to form a first via hole using the first photoresist patterns and then forming a resulting structure; coating a first anti-reflecting coating layer on the resulting structure with a low viscosity; coating a second anti-reflecting coating layer on the resulting structure with a low viscosity; forming second photoresist patterns on the second anti-reflecting coating layer; and forming a second via hole using the second photoresist patterns.

BRIEF DESCRIPTION OF THE DRAWINGS

Other aspects of the disclosed methods will become apparent from the following description of the embodiments with reference to the accompanying drawings, in which:

FIGS. 2A to 2E are cross-sectional views illustrating a method for forming a dual Damascene process to prevent a diffused reflection according to the present invention to.

DETAILED DESCRIPTION OF THE PRESENTLY PREFERRED EMBODIMENTS

Hereinafter, a method for forming fine patterns according to the present invention will described in detail referring the accompanying drawings.

Figure 1A:
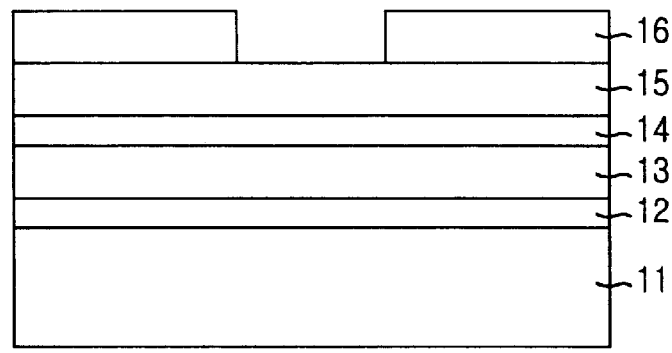
FIGS. 1A to 1D are cross-sectional views illustrating a method for forming a via first which is widely used in a conventional Damascene process.
Figure 1B:
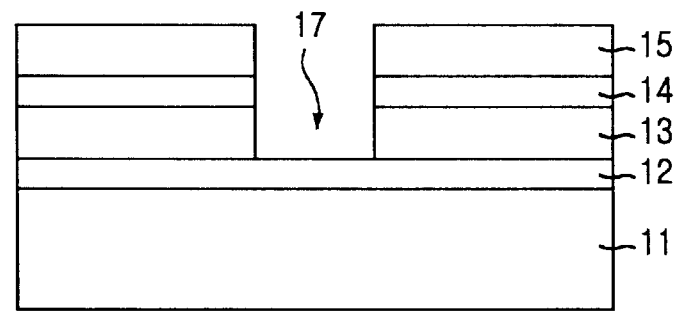
Figure 1C:
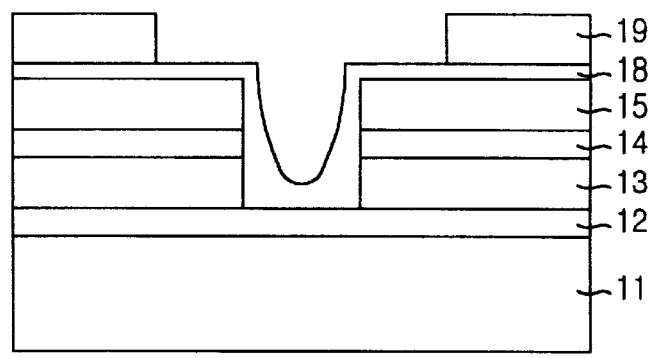
Figure 1D:
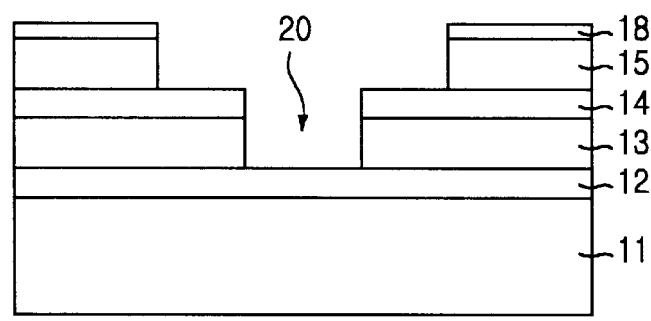
Figure 2A:
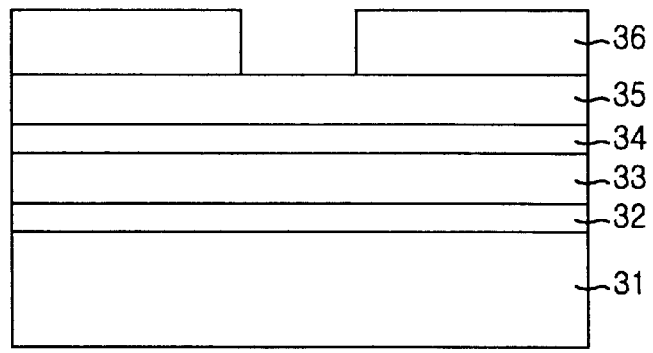

Referring to FIG. 2A, a first SiN layer 32, as an etching stopper layer, is formed on a semiconductor substrate 31 on which predetermined processes have been carried out. A first $SiO_2$ layer 33 is formed on the first SiN layer 32, a second SiN layer 34, as an etching stop layer, is formed on the $SiO_2$ layer 33 in a contact level of the topology, and then a second $SiO_2$ layer 35 is formed on the second SiN layer 34. Photoresist patterns 36 are formed on the second $SiO_2$ layer 35 using a photoresist layer.

Figure 2B:
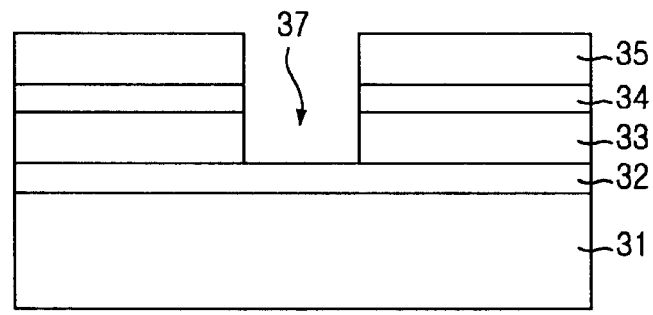

Referring to FIG. 2B, the second $SiO_2$ layer 35, the second SiN layer 34 and the first $SiO_2$ layer 33 are selectively etched using the photoresist patterns 36 as an etching mask layer, thereby forming a via hole 37.

Figure 2C:
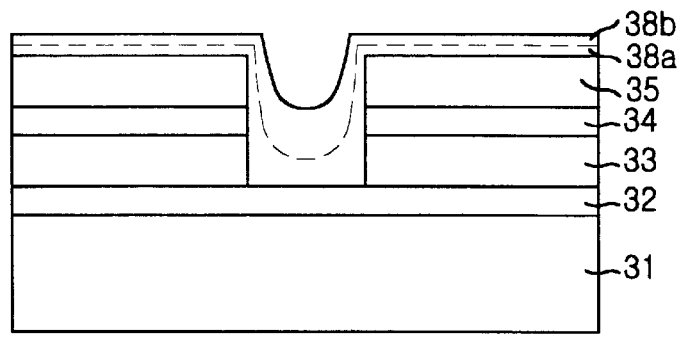

Referring to FIG. 2C, organic anti-reflecting coating layers (ARC) 38a and 38b are formed on the resulting structure through two deposition processes in order to prevent the pattern profile from being by a diffused reflection in the via hole 37. The ARC layer 38a is also deposited on the bottom of the via hole 37 with a low viscosity such that a 450 Å layer will be deposited at a 3000 rpm. The rpm or viscosity may be adjusted to provide a layer with a thickness ranging from about 500 Å to about 700 Å be deposited and the ARC layer 38b is also deposited on the ARC layer 38a with a low viscosity such that a 450 Å layer will be deposited at a 3000 rpm. The rpm or viscosity may be adjusted to provide a layer with a thickness ranging from about 500 Å to 700 Å be deposited. In the case of the ARC layer 38a, the semiconductor substrate 31 is first cooled and the semiconductor substrate 31 is cooled again after the spin coating process for the ARC layer 38a and the baking process are carried out. In the case of the ARC layer 38b, the semiconductor substrate 31 is cooled after the spin coating process and the baking process are carried out. Since the present invention uses the ARC layers having a low viscosity during the two continuous depositions of the spin coating process, a desired thickness of the ARC layers 38a and 38b may be obtained to prevent a diffused reflection completely. In the case where the viscosity of the ARC layers 38a and 38b are higher so that a thickness greater than approximately 450 Å results at 3000 rpm, it may be impossible to obtain a sufficient thickness of the ARC layers 38a and 38b at the bottom of the via hole 37. Accordingly, the two coating processes allow the ARC layers 38a and 38b with a low viscosity to have a sufficient thickness as illustrated above.

Figure 2D:
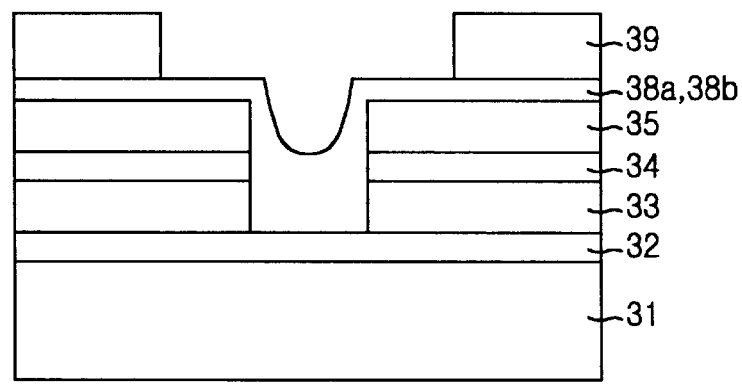

Referring to FIG. 2D, a photoresist layer is coated on the ARC layers 38a and 38b and is baked, and then the semiconductor substrate 31 is cooled. Subsequently, exposure and developing processes are carried out in order to form photoresist patterns 39 to expose the ARC layers 38a and 38b. At this step, the photoresist patterns 39 is formed to expose a top opening area broader than the via hole 37 which is required to form a metal interconnection to improve the step-coverage of the following metal layer.

Figure 2E:
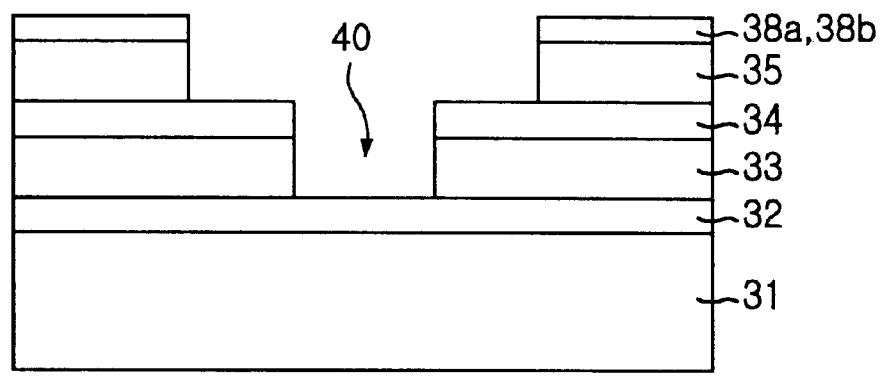

Referring to FIG. 2E, the exposed ARC layers 38a and 38b and the second $SiO_2$ layer 35 are etched using the photoresist patterns 39 as an etching mask, thereby forming a final step-type via hole 40. In the etching process, the ARC layers 38a and 38b may prevent the diffused reflection. A conducting layer (not shown) is deposited on the resulting structure including the via hole 40 and patterned by the etch-back process or the chemical mechanical polishing process so that the conducting layer, such as a metal wire, a word line or a bit line, remains only within the via hole 40. Since the ARC layers 38a and 38b with a low viscosity have a lower etching rate than the first $SiO_2$ layer 33, a predetermined thickness of the ARC layers 38a and 38b may remain on the bottom of the via hole 37. Accordingly, the remaining ARC layers 38a and 38b may prevent the loss of the via hole.

As apparent from the above, the disclosed methods provide a sufficient thickness of the ARC layer for preventing a diffused reflection by using the dual Damascene process to have two coating processes of the ARC layer. Therefore, the dual Damascene process according to the disclosed methods allow the semiconductor devices to be highly integrated and prevents the loss of the via hole, thereby improving the reliability of the devices.

Although the preferred embodiments have been disclosed for illustrative purposes, those skilled in the art will appreciate that various modifications, additions and substitutions are possible, without departing from the scope and spirit of the methods disclosed in the accompanying claims.

What is claimed:

1. A method for forming a metal wire using a Damascene process, the method comprising:

forming an insulation layer on a semiconductor substrate comprising elements for operating a semiconductor device;

forming first photoresist patterns on the insulation layer;

etching the insulation layer in order to form a first via hole using the first photoresist patterns and then forming a resulting structure;

coating a first anti-reflecting coating layer on the resulting structure and in the first via hole, wherein the first anti-reflecting coating layer has a viscosity such that the first anti-reflecting coating layer has a thickness of about 450 Å when deposited with a spin rate of about 3000 rpm;

coating a second anti-reflecting coating layer on the resulting structure and directly on the first anti-reflecting coating layer without previously etching the first anti-reflective layer to provide desired cumulative anti-reflective coating thickness, wherein the second anti-reflecting coating layer has a viscosity such that the second anti-reflecting coating layer has a thickness of about 450 Å when deposited with a spin rate of about 3000 rpm.;

forming second photoresist patterns on the second anti-reflecting coating layer; and forming a second via hole using the second photoresist patterns.

2. The method of claim 1, further comprising cooling the semiconductor substrate after forming each of the first and second anti reflecting coating layers.

3. The method of claim 2, wherein the insulation layer comprises a multilayer having $SiO_2$ and SiN layers which are alternately stacked.

4. The method of claim 3, wherein the insulation layer comprises:

a first SiN layer;

a $SiO_2$ layer formed on the first SiN layer; and a second SiN layer on the $SiO_2$ layer.

5. The method of claim 4, further comprising reaming a portion of the second anti reflecting coating layer on the first SIN layer for preventing a loss of the second via hole.

6. The method of claim 1, wherein the first anti reflecting coating layer has a thickness ranging from about 500 Å to about 700 Å.

7. The method of claim 1, wherein the second anti reflecting coating layer has a thickness ranging from about 500 Å to about 700 Å.

8. The method of claim 1 wherein the first and second anti reflecting coating layers are organic coating layers.

9. A semiconductor device made in accordance with claim 1.

10. A semiconductor device made in accordance with claim 2.

11. A semiconductor device made in accordance with claim 3.

12. A semiconductor device made in accordance with claim 4.

13. A semiconductor device made in accordance with claim 5.

14. A semiconductor device made in accordance with claim 6.

15. A semiconductor device made in accordance with claim 7.

16. A semiconductor device made in accordance with claim 8.

* * * * *

UNITED STATES PATENT AND TRADEMARK OFFICE
CERTIFICATE OF CORRECTION

PATENT NO. : 6,764,944 B2 Page 1 of 1
DATED : July 20, 2004
INVENTOR(S) : Young-Mo Lee et al.

It is certified that error appears in the above-identified patent and that said Letters Patent is hereby corrected as shown below:

Column 5,
Line 3, please delete "SIN" and replace with -- SiN --.

Signed and Sealed this

Ninth Day of November, 2004

JON W. DUDAS
*Director of the United States Patent and Trademark Office*